Figure 1:
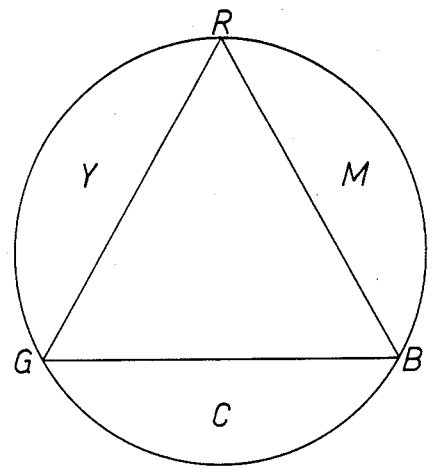

United States Patent [19]

Phillips

[11] Patent Number: 4,629,428
[45] Date of Patent: Dec. 16, 1986

[54] COLOR PRINTING PROCESS AND EQUIPMENT

[76] Inventor: Gordon L. P. Phillips, 243, Cyncoed Road, Cardiff, Glamorgan, United Kingdom

[21] Appl. No.: 590,370

[22] Filed: Mar. 16, 1984

[30] Foreign Application Priority Data

Mar. 18, 1983 [GB] United Kingdom ................. 8307290

[51] Int. Cl.$^4$ ............................................. G09B 19/00
[52] U.S. Cl. ..................................................... 434/98
[58] Field of Search ...................... 206/81; 434/84, 98, 434/102, 367

[56] References Cited

U.S. PATENT DOCUMENTS

| 1,480,458 | 1/1924 | Mershon | 434/84 |
| 1,703,449 | 2/1929 | Huebner | 434/98 X |
| 1,957,816 | 5/1934 | Braeg | 434/98 |
| 2,285,379 | 6/1942 | Sherman | 434/367 |
| 3,314,167 | 4/1967 | Allgood | 434/102 |
| 4,299,165 | 11/1981 | Nichols | 434/98 X |

FOREIGN PATENT DOCUMENTS 477808 6/1929 Fed. Rep. of Germany ........ 434/98

OTHER PUBLICATIONS

Dupont Magazine, Sep.-Oct. 1968, Front cover and pp. 2, 3, 4, 5.

Primary Examiner—Harland S. Skogquist
Attorney, Agent, or Firm—Young & Thompson

[57] ABSTRACT

Colored art work is produced by the use of a kit comprising a collection of small process color reference "tints" printed from selected combinations of three standard process colors, optionally with black, at selected percentage densities. The reference tints are arranged in groups with all the tints in one group having the same percentage, but varying combinations of process colors, and each of the tints is identified by a reference index. The kit also includes larger "cut-out tints" identifiable with individual reference tints and each of exactly the same tone as the corresponding reference tint.

18 Claims, 10 Drawing Figures

FIG. 5.

COLOR PRINTING PROCESS AND EQUIPMENT

This invention relates to colour printing and it is a general object of the invention to assist the designer in making an original colour determination and also to assist the printer in obtaining accurately controlled colour in the final printed product.

Existing colour printing procedures suffer from many problems and limitations. It is extremely difficult to control accurately the hue and tone of the final printwork and it is also difficult to relate the final printwork exactly to the specification or art-work from which it derives. This creates serious problems for the printer and different though equally serious problems for the designer or artist.

The problems exist in most types of colour printing but the present invention is particularly though not exclusively applicable to coloured lay outs or art-work which include areas of a single uniform colour commonly known as "tints".

For convenience in this specification the following terms are used with the specified meanings:

Tone—The visual colour appearance of an object or surface to the human eye, whether it relates to original graphic art, a colour photograph, a coloured ink, or coloured print-work. Tone relates to the frequency and wavelength of light.

Tint—Variations in the intensity of colour ranging from a shallow near-white version of the colour to the deepest possible tint of the same colour. "Tint" concerns variations in the appearance of a single or multiple colour brought about by printing smaller areas of such colours, usually by use of "dot screens". The word "tint" may also refer to larger areas of a uniform or graduated colour.

Complimentary Colours—The three colours (usually cyan, yellow and magenta) used in colour printing to provide the full range of colours across the whole visible spectrum.

One well known existing process for printing "flat" coloured areas or "tints" is to use so called "line colours". Known as "line printing" this involves printing with inks of any colour, including tints of those colours, using mechanical screens. These inks are commercially available from a number of sources and consist essentially of eight or more standard coloured inks, which can be selected by the designer or printer from specimen charts to generate final print-work conforming hopefully to any colour on the chart. The chart contains detailed instructions for mixing the inks in varying proportions to produce any selected colour on the chart. Difficulties which occur are numerous. The coloured inks available to the printer may not correspond exactly with the colours of the specimen charts, and the printer may have great difficulty in mixing up ink combinations exactly to the specified combination figures.

Another widely used colour printing process uses three specified "process colours" printed in varying tint combinations, based on the well known triple "primary colour" effect. Theoretically each process colour is a mixture of two primary colours, and is deficient in the third primary. The "process" colours are magenta, cyan and yellow, and are "complimentaries" of the three optical "primaries" (green, red, and blue, and can be combined at different individual tint values to give a very wide colour range. The final visual tone or colour is controlled by inserting a pre-printed grid screen in the optical path when preparing the individual colour litho plates, each screen having a pre-printed pattern of small opaque areas (referred to hereinafter for convenience as "dots" though any other pattern of areas may suffice) which combine to obstruct a specified percentage of light. Thus a 10% screen produces a very light tint and a 50% screen produces one half of the full tint.

In this "process colour" system the tints of the three process colours, which are vital to the appearance of the final print-work, are governed partly by the performance of the grid screens used in the photographic preparation of the litho plates for the final printing. These grid screens may be specified in percentage terms or by the number of dots or lines to the inch, but these definitions are not sufficient to govern the screen effect fully and screens can vary appreciably when supplied from different sources. Problems also arise in printing due to "dot shrinkage", and "dot growth", problems which are well known to colour printers and extremely difficult to eliminate or control. A further problem arises from so called "Moiré fringe pattern" effects which cause unsightly repeating patterns in certain combinations as will be explained in more detail below.

Another serious problem in existing process colour systems is the difficulty in making a colour choice. Since no samples are available the designer must either attempt to describe a tone in words, or select a sample of the appropriate tone from some other coloured materials. The printer then by a combination of skill, experience and guesswork produces a specimen tone, by making an arbitrary selection from the available combinations. Assuming that he has available 9 different "percentage screens" (10%, 20% . . . 90%) with three process colours, and black as an extra, the total number of possible tones theoretically available will be many thousands. Some of these may have to be rejected for reasons other than colour match, but the choice is in practice too wide for practical convenience. The result often is that the proofing sheets are not acceptable to the designer, and the printer is forced to repeat the whole selection procedure.

Broadly stated from one aspect the invention consists in a kit for use in preparing and printing coloured art work, comprising a collection of small process colour reference "tints" printed from selected combinations of three standard process colours, with optional black, at selected percentage densities, the reference tints being arranged in groups with all the tints in one group having the same percentages but varying combinations of process colours, and each of the tints identified by a reference index, the kit including also larger "cut-out tints'" identifiable with individual reference tints and each of exactly the same tone as the corresponding reference tint. Preferably the small reference tints are arranged in sub-groups identifiable with reference to particular selections and combinations of process colours, with black, and more conveniently the reference tints are arranged in orthogonal rows and columns of which one represents selected percentage densities, while the other represents selected combinations of process colours, with optional black. Since the visual appearance can vary appreciably with different surface textures the reference tints are preferably printed on to a plurality of different surface qualities.

The presence of Moiré patterns is objectionable and hitherto was very difficult to eliminate, but according to another preferred feature of the invention the elimination is applied before the reference tints are grouped:

in other words substantialy all the tints are free of Moiré patterns.

The invention enables the number of tints to be reduced very effectively and preferably there are less than 500, and possibly not more than 300, different tints all distinguishable from each other.

In any case, the kit includes or is associated with means to identify the standard process colours adopted for the tints and for the final printwork. There should also be means to identify the shapes, patterns and densities of the dots or other shapes in the percentage density screens, and line spacing and angle.

The invention also consists in a method of creating coloured art work from a kit as defined, in which tones are selected from solid reference tints and areas from the said corresponding cut-out tints are cut out to build up the art work, and in which the final colour reproduction printwork is produced using percentage screens and process colours exactly as identified by the reference index for each selected tint of the art work.

Furthermore, the invention from another aspect also consists in a method of producing colour printwork from a graphic colour layout created by the method in which standard process colours are selected as specified in said kit selected percentage screens for the individual process colours are selected or generated from the groupings of said reference tints, colour litho plates are created photographically by use of such screens, or an equivalent digital scanning system, and the final colour printing is performed on the same selected surfaces as specified in said kit and using exactly the same specified printing parameters.

The invention also resides in coloured printwork produced by means of a kit or process as defined.

Figure 2A:
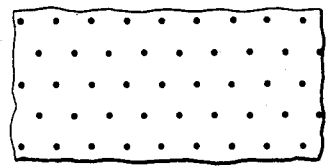
Figure 3A:
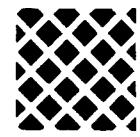
Figure 2B:
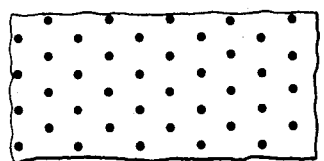
Figure 3B:
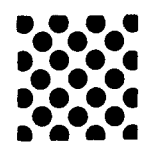
Figure 2C:
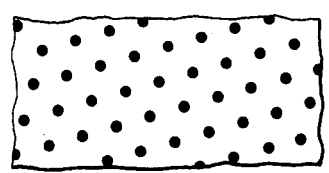
Figure 3C:
Figure 3D:
Figure 4:
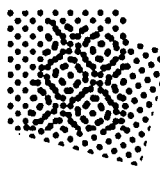

The invention may be performed in various ways and one specific embodiment with a number of possible modifications will now be described, by way of example, with reference to the accompanying drawings, in which:

FIG. 1 is a conventional colour diagram illustrating the relationship between primary colours and corresponding process colours, FIGS. 2(*a*), 2(*b*) and 2(*c*) are magnified views illustrating three photographic grid screens of different percentage tint values, and with the screens oriented at different angles, FIGS. 3(*a*), 3(*b*), 3(*c*) and 3(*d*) illustrate to a greater magnification some of the many possible shapes and patterns of dots on the screens, FIG. 4 illustrates on an enlarged scale one form of "Moiré pattern", which may result from overlapping dot screens, and FIG. 5 illustrates on a reduced scale a chart of preprinted sample coloured tints for use in the invention.

The system relies on standardisation of a number of vital elements in the overall procedure. At the outset a range of carefully selected tints are produced using three selected "process colours", and black, and the same tints are also printed on large sheets for use by the graphic artist.

FIG. 1 merely illustrates diagrammatically the optical relationship between three primary colours R (Red), G (Green) and B (Blue) and the three complimentary process colours Y (Yellow), M (Magenta), C (Cyan). Each process colour is a compliment of the opposed primary and in theory each process colour is a mixture of the other two primaries and deficient in the third primary. Various different International standards are well established to identify process colours and it is sufficient for the purposes of this invention that the particular standard selected should be identified. Process colours obtained from any reliable source can then be guaranteed to conform to the specification. In preparing the printed tints from the three process colours, and black, an optical screen is used to adjust the density. The screen normally consists of a pattern of dots or other shapes and the control effect is governed by a number of variables. Firstly, there is the shape of the individual dots or other shapes. Four examples are illustrated in FIGS. 3(*a*) to 3(*d*), FIG. 3(*a*) illustrating square dots, FIG. 3(*b*) round dots, FIG. 3(*c*) pincushion dots, and 3(*d*) parallel lines. There are many other possible shapes and patterns that may be employed and it is important that the particular selected pattern should be identified and specified.

Secondly, it will be seen that the dot patterns normally present themselves in rows or lines and it is important to specify the angular direction or orientation of these rows. Significant differences in the printed product result from changes in this angular adjustment.

Thirdly, the dot screens are selected in accordance with the overall density of the black dots or lines in relation to the clear background of the screen. This density may be referred to as the "percentage value" and three examples are illustrated in FIGS. 2(*a*) to 2(*c*) where FIG. 2(*a*) represents, for example, 5%, FIG. 2(*b*) 10%, FIG. 2(*c*) 15%. It will be noted in the same Figures that the angular orientation of the rows of dots is different between the different Figures.

One of the problems encountered in combining dot screens for multi-colour printing is that occasionally the screens interact to generate an unwanted further effect known as a Moiré pattern. A typical example is illustrated in FIG. 4 which shows two plain round dot screens overlapping and generating a rectangular Moiré pattern at the overlap. Where this occurs it is important that steps should be taken to remove it and the invention achieves this very simply.

The kit provided in accordance with the invention for use by a graphic artist consists of three colour chart sheets each in the form illustrated in FIG. 5, together with a number of larger sheets each printed overall with one of the tints shown on the charts.

Referring first to FIG. 5, the chart is organised in twelve vertical columns and six horizontal rows. The vertical columns 1 to 12 each define a selection or combination of the three process colours with black and in the present example these vertical columns are identified as follows:

1. 4 Colours
2. Minus Black
3. Minus Magenta
4. Minus Cyan
5. Minus Yellow
6. Minus Black & Magenta
7. Minus Black & Cyan
8. Minus Black & Yellow
9. Minus Cyan & Magenta
10. Minus Cyan & Yellow
11. Minus Magenta & Yellow
12. Single Colours Each of the horizontal rows is identified with a particular combination of percentage screens and in the present example these are selected as follows:

A=35% C (Cyan), 75% M (Magenta) 60% Y (Yellow), 50% Black.

B=60% C, 80% M, 75% Y, 50% Black.
C=75% C, 85% M, 80% Y, 50% Black.
D=80% C, 35% M, 85% Y, 50% Black.
E=85% C, 60% M, 35% Y, 50% Black.

The horizontal row S is differently organised. The first two squares under columns 1 and 2 are sub-divided into halves and each represents a 100% tint of one of the three process colours, with black as the fourth. The next 3 squares under columns 3, 4 and 5, represent 100% tints of two colour combinations from the three process colours. The next six squares under columns 6 to 11 represent a 100% tint of one of the process colours with 50% Black, followed by a two colour tint of two process colour combinations with 50% Black. The final square under column 12 represents 50% Black without process colour.

In the vertical column 12 each square is sub-divided into three and each of these represents one of the process colours printed at the percentage value indicated for the corresponding horizontal row, without other colours or black.

Each one of the squares throughout the chart is identified by a reference number printed below the square and there may be a total of three charts each with 84 tint areas making a combined total of 252.

Additionally each sheet of the charts or kit identifies the type of dot shape and dot pattern used, as explained above with reference to FIGS. 2 and 3, the percentage values of the screens of course being indicated to the left of the chart as pointed out above. The particular standard process colours used in printing the charts are also identified so that precisely the same process colours can be selected and used in a final printing.

In preparing the charts particular attention is paid to the presence of any undesirable Moiré patterns. If it is found that these occur from any combination of the different percentage screens then the choice of percentages is readjusted to eliminate any tint with the Moiré pattern. This is a time consuming operation initially, but once the charts have been prepared this then totally eliminates Moire patterns from all resultant printwork, a very great saving in time to the printer.

It will be understood that with ten or more possible percentage screens available between 0% and 50% a very large number of possible combinations and corresponding tints can be produced from the three process colours with Black. The total number is in fact far in excess of what is needed by any graphic artist and furthermore the total range generates many tints which are almost identical with other tints in the range. Therefore, in selecting the percentages for the horizontal rows in the three charts very careful attention is given to eliminating tints which are practically identical with others thus providing the maximum possible choice within a compact selection.

A very important aspect of this system is that all the tints in any one horizontal row can be produced by the printer using only the one set of percentage dot screens shown to the left of that row. Therefore, if the graphic artist is willing to confine his selection to one row or to a small number of rows the printer's task is greatly facilitated and great economies can be effected in printing costs.

The appearance of colour printwork varies appreciably with the quality of the surface on which the colours are printed and to provide the graphic artist with a ready gauge for this variable factor the three charts may be reprinted on two or three different types of surface such as art paper, mat paper and "laminated" paper, i.e. with a thin plastic overlay or skin.

In use the graphic artist first selects the quality of paper and the appropriate group of three charts and then selects from these charts the particular tint or tints required for the particular colour printwork. Preferably the selected tints will all lie in one horizontal row, but that is not essential, as explained above. Having identified the tints the artist then picks out corresponding sheets from the large preprinted tint sheets provided in the kit and then in the normal way by use of scissors and glue builds up the initial colour layout. If the artist finds that any of the tints conflict it is a simple matter to select another tint from the chart and cut out a corresponding area from the respective tint sheet provided in the kit. After the initial art layout has been approved it is then handed to the colour printer with an identification of each of the colour tint zones derived from the reference numbers printed below the individual squares on the charts.

Each of these reference numbers then identifies for the colour printer exactly what percentage screens to use and which of the process colours are to be applied. There is absolutely no question of the printer having to match colours and tints and no Moiré fringe problem can arise. If the selection of tints is all in one horizontal row the printer only needs to use the four specified dot screens and it becomes a question merely of colour combinations to select.

In the actual printing process there are a number of variable factors which can be adjusted in addition to the factors specified above which may be referred to as the variable tint selecting factors. The remaining factors may be standardised and the kit preferably includes instructions to the colour printer how to adjust or set these standard factors. This may apply, for example, to the factors which control "dot gain". In "printing down" to produce the litho plate there is normally a small reduction in dot size but when "printing up" in the final printing operation there is a marked increase in dot size referred to as "dot gain". This is a variable effect which is difficult to control and can be altered by a number of different factors. In performing the present invention some of these factors can be specified to the printer and others can be included and determined within the system. In one respect the system provides automatic dot gain control. By using the very same grid screens and the same process colours and controlled temperatures, printing pressures, and other normal printing parameters, such as choice of blanket rollers and "nip pressure", the sample tones are produced under substantially the same printing conditions as the final printwork. Thus dot gain for example will have substantially the same effect on the sample tones as in the final printwork.

The photographic grid screens used in process colour systems may be replaced by an electronic scanning process, which is known in itself and requires no detailed description. The electronic scanner is programmed to generate the required screen pattern digitally and directly on to the film instead of through the medium of the normal, photographic grid contact screens. Digital electronic scanning can also be used in the present invention to replace the use of photographic grid screens. In one possible procedure programmes are prepared and retained in the electronic memory corresponding to the different "percentage screens" required for a particular system. These programmes can then be recovered instantly and used for preparing the initial pre-printed tones and in the final colour printing stages.

As explained, this invention provides a very adequate selection of possible tones without the vast numbers found in some colour charts. In practice it is found that an adequate range can be produced by careful selection with less than 500, and preferably less than 300, individual tints. If any nearly duplicated tints are eliminated, and also any tint with a Moiré pattern, a full colour range is available.

Another factor affecting the final product is the line spacing or dot spacing of the percentage screens and this also needs to be specified in the kit. In some cases a graduated tint of varying density across the printed area is required and this also can be achieved by specifying the graduation and providing additional reference tints and cut-out tints accordingly.

I claim:

1. A colour matching device for use in process colour printing, comprising a plurality of small printed process colour areas, each representing a different reference "tint" for use in the final colour printing, the said printed areas being arranged in identifiable groups, and all the printed areas in each group being printed by means of selected process colours, each at a uniform selected percentage density within the said group, and each printed area being individually identifiable.

2. A colour matching device according to claim 1, wherein each group of printed areas is printed from two or more process colours with optional black, each colour at a uniform density within the said group, and wherein the chart includes further groups, each having printed areas likewise printed from two or more process colours, with optional black, and each at a uniform density within the respective group, but at an overall density combination different from other groups.

3. A colour matching device according to claim 2, wherein each of the said groups comprises areas printed by the selected process colours at the said uniform selected density within each group, the said printed areas within each individual group having different ones of said process colours omitted.

4. A colour matching device according to claim 3, wherein the printed areas within each individual group include a plurality of tints from which the said process colours are omitted singly, and in pairs, and triplets.

5. A colour matching device according to claim 3, including further printed areas representing tints of one single process colour, at the same uniform selected density of the said group.

6. A colour matching device according to claim 1, wherein the process colour densities vary by small standard percentage intervals, and a limited selection of percentage densities is used for each process colour.

7. A colour matching device according to claim 1, wherein each of the groups is arranged with printed areas of the said group in a row on a common printed chart.

8. A device according to claim 1, in which the printed areas are arranged on a chart in orthogonal rows and columns, of which one represents selected percentage densities, while the other represents selected combinations of process colours, with optional black.

9. A device according to claim 1, in which the printed areas are printed with the same process colours and combinations and percentage densities on a plurality of different surface qualities.

10. A device according to claim 1, in which substantially all the areas are free of Moiré patterns.

11. A device according to claim 1, extending over the whole visible colour spectrum and comprising not more than 500 different tints, all distinguishable from each other.

12. A kit for use in colour printing, comprising a colour matching device according to claim 1, and in combination a plurality of larger printed coloured sheets, each corresponding exactly by percentage density and dot size and distribution with a respective one of said small printed areas, each of said larger and small printed areas having identification means to facilitate matching.

13. A method of colour printing in which preliminary coloured art work is prepared by selecting desired colour tints from the small printed areas of a colour matching device according to claim 1, corresponding coloured areas are selected from a plurality of larger pre-printed sheets each corresponding exactly in density and tone with the respective small coloured area, and the final colour printwork is produced using percentage screens and process colours exactly corresponding to the selected identified small printed process colour areas.

14. Coloured printwork when produced by the process of claim 13.

15. A colour matching device for use in process colour printing, comprising a plurality of small printed colour areas, each representing a different reference tint for use in the final colour printing, the said printed areas being arranged in identified groups, and all the printed areas in each group being printed by use of the selected three process colours with optional black, different areas having different ones of said process colours and black omitted.

16. A colour matching device according to claim 15, wherein the printed areas within each individual group include a plurality of tints from which the said process colours are omitted singly, and in pairs, and triplets.

17. A colour matching device according to claim 15, in which each group includes at least three printed areas each produced from a single one of the said selected process colours, with a further area produced from a combination of all three process colours with optional black.

18. Colour printwork when produced by means of a colour matching device according to claim 15.

* * * * *